United States Patent
Zhang et al.

(10) Patent No.: US 10,730,113 B2
(45) Date of Patent: Aug. 4, 2020

(54) LARGE-SCALE MULTI STEP SYNTHESIS METHOD FOR ULTRALONG SILVER NANOWIRE WITH CONTROLLABLE DIAMETER

(71) Applicant: SOUTHEAST UNIVERSITY, Nanjing (CN)

(72) Inventors: Xiaoyang Zhang, Nanjing (CN); Tong Zhang, Nanjing (CN); Xiaomei Xue, Nanjing (CN)

(73) Assignee: SOUTHEAST UNIVERSITY, Nanjing (CN)

(*) Notice: Subject to any disclaimer, the term of this patent is extended or adjusted under 35 U.S.C. 154(b) by 0 days.

(21) Appl. No.: 15/735,129

(22) PCT Filed: Mar. 3, 2017

(86) PCT No.: PCT/CN2017/075603
§ 371 (c)(1),
(2) Date: Dec. 8, 2017

(87) PCT Pub. No.: WO2018/076588
PCT Pub. Date: May 3, 2018

(65) Prior Publication Data
US 2019/0168309 A1 Jun. 6, 2019

(30) Foreign Application Priority Data
Oct. 26, 2016 (CN) .......................... 2016 1 0945263

(51) Int. Cl.
*B22F 9/24* (2006.01)
*C30B 29/60* (2006.01)
*C30B 29/02* (2006.01)
*C30B 7/14* (2006.01)
*B82Y 40/00* (2011.01)
*B22F 1/00* (2006.01)
*C22C 5/06* (2006.01)
*C22C 1/04* (2006.01)

(52) U.S. Cl.
CPC .............. *B22F 9/24* (2013.01); *C30B 7/14* (2013.01); *C30B 29/02* (2013.01); *C30B 29/60* (2013.01); *B22F 1/0025* (2013.01); *B22F 2009/245* (2013.01); *B82Y 40/00* (2013.01); *C22C 1/0466* (2013.01); *C22C 5/06* (2013.01)

(58) Field of Classification Search
None
See application file for complete search history.

(56) References Cited

U.S. PATENT DOCUMENTS

2016/0082418 A1* 3/2016 Qin ..................... B22F 1/0025
502/330

OTHER PUBLICATIONS

Ma et al. Rapid production of silver nanowires based on high concentration of AgNO3 precursor and use of FeCl3 as reaction promoter. RSC Adv., 2014, 4, 21060-21071 (Year: 2014).*

* cited by examiner

*Primary Examiner* — Tanisha Diggs
(74) *Attorney, Agent, or Firm* — CBM Patent Consulting, LLC

(57) ABSTRACT

A large-scale multi-step synthesis method for ultralong silver nanowire with controllable diameter, comprises: an ethylene glycol solution containing polyvinylpyrrolidone and sodium chloride is fully heated to obtain a solution with strong reducibility, and then silver nitrate in glycol solution is added for a generation of a large number of crystal seeds; hydrogen peroxide is used to achieve the selection of the crystal seeds for a small amount of crystal seeds with particular sizes; the temperature is immediately raised to increase the reaction rate until the threshold of the etching crystal seeds of nitric acid is broke through; the temperature is lowered for long-timed reaction to slow down the reaction rate, reduce the probability of the isotropic seeds by self-nucleation and promote the absorption of small nucleus in the radial direction of large nucleus or nanowire, thus obtaining the ultralong silver nanowire.

7 Claims, 2 Drawing Sheets

LARGE-SCALE MULTI STEP SYNTHESIS METHOD FOR ULTRALONG SILVER NANOWIRE WITH CONTROLLABLE DIAMETER

This application is the U.S. national phase of International Application No. PCT/CN2017/075603 filed on 3 Mar. 2017 which designated the U.S. and claims priority to Chinese Application No. CN201610945263.9 filed on 26 Oct. 2016, the entire contents of each of which are hereby incorporated by reference.

TECHNICAL FIELD

The present invention relates to the field of nano materials, waveguide, thin film devices, in particular, to a large-scale multi-step synthesis method for ultralong silver nanowire with controllable diameter.

BACKGROUND

Silver nanowires, which inherit excellent conductivity and thermal conductivity of block silver, are one of the best choices for efficient transmission of electrical signals. Moreover, as one-dimensional precious metal nanomaterials, the silver nanowires, which have surface plasmonic effects, can excite surface plasmonic polariton (SPP) mode propagating along the interface between the metal and the medium, thus confining the light beam within the nanometer scale and breaking the optical diffraction limit, causing a great application potential in the nanoscale optoelectronics field. Furthermore, interacting with light the silver nanowires can excite unique localized surface plasmon resonance (SPR) and thus cause strong absorption in UV and visible light band, which is great significant for the applications of the thin film devices and non-linear enhancement. Such characteristics and application directions of silver nanowires are related closely to the diameter, to be specific, the nanowires with thick diameter are more suitable for the field of subwavelength waveguide devices and those with thin diameter are mainly applied in the field of thin film devices.

For waveguide devices, limited by the optical diffraction limit, the mode size of light in traditional medium waveguide is generally between several to dozens of microns. Later, waveguides made of materials with high diffraction were able to limit the mode size to several hundreds of nanometers. However, such scale still fails to reach the scale of integrated electronic chips, which makes it difficult to achieve nanoscale integrated optoelectronic system and optoelectronic hybrid system. Silver nanowire waveguides based on SPP excite the surface electromagnetic wave transmitting between the interface of metal and medium and can limit the light in nanoscale space. Such limiting ability is stronger than that of traditional dielectric waveguide and supports a smaller mode spot. Nanowires waveguide essentially break through the limitation of optical diffraction limits, thus significantly improving the integration of optical devices and being one of key techniques of achieving the next generation of ultra-large-scale integrated photonic chip system; at the same time, as the silver can transmit both optical signal and electrical signal, the surface plasmon waveguide can also be used to achieve a photoelectric hybrid system. The transmitting efficiency of light in silver nanowire waveguide is closely related to the diameter of nanowires. The thicker the diameter of nanowires, the more the energy constrained inside the nanowires, the less the outside energy of evanescent wave and the further the transmitting distance. At the same time, the transmitting mode of light within nanowires is closely related to the diameter. Owning to the larger consumption relative to fundamental mode, high-order mode must be achieved by the nanowires with thick diameter. In addition, nanowires with thick diameter can also achieve more novel applications. When applied in the field of thin film devices, the scattering effects of the thick nanowires contributes to conductive reflective thin films; when applied in the field of new energy, nanowires can play positive roles on the backplane of solar cells such as promoting the secondary absorption of light, and so on. The length of silver nanowires should be also increased while thickening the diameter of nanowires. Long nanowires can interact with the gain medium to achieve long range transmission and further diversify the function of subwavelength waveguide devices. However, the current thickest diameter of silver nanowires can only reach two or three hundred nanometers with the length of one hundred microns. Waveguides made by such nanowires cause shorter transmission distance, large transmission loss of high-order mode and single function, which makes it hard to achieve the practical application of nanoscale optical waveguides to the integrated optoelectronic devices and photoelectric hybrid circuits. Thus, it is the only way to prepare nanowires with thicker diameter and longer length for propelling further forward development of subwavelength waveguide devices and implementing applications.

In the field of thin film devices, the thin film devices prepared by the traditional material, indium tin oxide (ITO), have several unavoidable disadvantages such as poor flexibility, fragile, costly and resources shortage, resulting in being difficult to satisfy the demands of the development of flexible electronic devices. The silver nanowires interacting with light excite surface plasmon resonance effects, which show as two characteristic peaks in the transverse and longitudinal directions. When the nanowire is longer, the longitudinal characteristic peak red-shifts to infrared range only with the transverse peak in visible light band occurs, thus having high transmittance in the visible light band. When the silver nanowires with high transmittance are interconnected to form network, the thin film devices are allowed to have excellent electrical conductivity; besides, the nanowires have the advantages of excellent flexibility, stable chemical performance, simply prepared, low-cost and applicable for industrial production. Therefore, silver nanowires are considered the most potential alternative for ITO to prepare high-quality thin film devices. The performance of thin film devices based on silver nanowires depends on several important parameters: haze, transmittance and sheet resistance. Haze, an important parameter that describes the degree of fuzzy of things that people see, is the bottleneck restricting the current development of silver nanowire thin film devices. Haze is decided by the scattering ability in broad spectrum range of the nanowires, which is related closely to the diameter of nanowires. Silver nanowires with thick diameter have strong scattering effect, causing high haze and the sharp decrease of the clarity of thin film devices; when the diameter of nanowires is about 10 nm, the haze problem of thin film devices can be effectively improved so as to reach the haze level for ITO based thin film devices. Transmittance, a key parameter to characterize the transparent properties of thin film devices, is dependent on the SPR effect of nanowires. With the decrease of the diameter, the resonance peak blue shifts leading to higher transmittance. Transmittance also varies with the aspect ratio of silver nanowires. When silver nanowires interconnected to a thin film, light may be partly blocked out by a great deal of nodes formed by the intersections among nanowires. Therefore, the longer the aspect ratio, the less the nodes and the better the performance of transmittance. Sheet resistance used to indicate the conductivity of the thin film devices increases with the decrease of the diameter of nanowires, that is to say, the thinner the nanowires, the larger the sheet resistance, so that the poorer the conductivity. Thus, reducing the diameter and increasing the aspect ratio of silver nanowires are greatly conducive to improving the haze problem and transmittance of thin film devices, however, reduce the conductivity to some extent. Consequently, there is an irreconcilable contradiction among these three parameters. Theoretical studies have shown that the silver nanowires with the diameter of 10 nm can take in account above performances, which can ensure a good conductivity while effectively improving the haze of thin film. But the extant preparation method neither prepares nanowires with the diameter of 10 nm, nor achieves large-scale industrial production with high yield. Therefore, it is an inevitable choice to prepare nanowires with thin diameter and high aspect ratio for improving transmittance of thin film devices and solving the haze problem.

The current preparation method for silver nanowires is mainly Polyol method. The silver nanowires are prepared by one-step method where the silver nitrate is reduced by glyoxal, which is produced under high temperature by the decompensation of ethylene glycol, with the protection of polyvinylpyrrolidone and the supplementary effect of sodium chloride. This method achieves the controllable growth of nanowires by precisely controlling the yield and output of seeds. However, two phases of forming crystal seeds and longitudinal growth in one-step method go on simultaneously and interfere with each other. In the phase of forming crystal seeds, longitudinal growth along existed crystal seeds may increase the non-uniformity of the diameter; and in the phase of longitudinal growth, new isotropic seeds generated by self-nucleation may gravely block the production of nanowires and also consume the silver sources which should be used for longitudinal growth, leading to the decrease of the length and yield of silver nanowires. Once the amount of reaction is enlarged, the isotropic seeds formed by self-nucleation in the reaction system may severely retard the generation of nanowires so as to result in low yield nanowires or even being unable to obtain silver nanowires, which makes it incapable to achieve industrial production. In addition, the seeds are seriously susceptible to the uncontrollable factors such as the additions, purity of medicine, temperature, humidity and exposure degree to air during growth, thereby causing the key step, the phase of the formation of seeds, hard to be precisely controlled and the synthesis reaction difficult to be repeated. Many researchers have expanded their studies on one-step method. However, there are still many blocks to be solved in one-step method, which is inaccessible to meet the demands for controllable growth, industrial production and application of silver nanowires. Thus, it is necessary and urgent to improve or propose a preparation method for silver nanowires to break through the current range of diameter and obtain the silver nanowires with uniform diameter and longer length, which is the pressing problem to be solved immediately in the field of waveguide devices and thin film devices.

SUMMARY

Technical Problems

The purpose of the present invention is to overcome the drawback of extant techniques by providing a large-scale multi-step synthesis method for ultralong silver nanowire with controllable diameter. This method has the advantages such as simple preparation, good repeatability and applicability for industrial production; the prepared silver nanowires have a controllable diameter, extremely-long length, and applied considerably in the field of thin film devices and waveguide lighting.

Technical Scheme

A method of large-scale multi-step synthesis for an ultralong silver nanowire with a controllable diameter comprising the following steps:

step 1, phase of screening of crystal seeds:
heating ethylene glycol solution containing a surfactant at a temperature of 140 to 160° C. to obtain a solution I with a strong reducibility; adding alkali metal halide dissolved in ethylene glycol into the solution I to yield a solution II; dissolving silver nitrate in ethylene glycol for preparing a precursor solution, the concentration of silver nitrate is between 0.001 to 5 mol/L;

adding the precursor solution into the solution II that reduces silver nitrate rapidly into a large number of multiple twinned crystal seeds with different sizes and part of isotropic seeds; adding etching agent into the above solution with a large number of crystal seeds results in preferentially etching the isotropic seeds which are not resistant to etching and the multiple various sizes of the twinned crystals, thus screening limited amount of particular sizes of the multiple twinned crystal seeds;

step 2, phase of breaking through the threshold of etching multiple twinned crystal seeds:
after the addition of etching agent in Step 1, increasing the reaction temperature immediately to 160-200° C. for a continuous reaction in the temperature until turbidities appearing; increasing the temperature significantly boosts the reaction rate until the threshold of etching multiple twinned crystal seeds by few by-products, namely nitric acid, is broken through;

step 3, phase of longitudinal growth:
decreasing the reaction temperature to 60-140° C. for a completed reaction under such condition once the appearance of turbidities; the decrease of temperature, which effectively reduces the reaction rate and depletes the isotropic seeds generated by self-nucleation, allows more free silver ions to be reduced longitudinally along nanowires for obtaining ultralong silver nanowires.

wherein the surfactant is polyvinylpyrrolidone (PVP) or the surfactant is capable of being absorbed on <100> crystal surface, mainly including sodium polystyrene sulphonate (PSS), polyacrylic acid (PAA); the concentration of PVP in the reaction system is 0.001-10 mol/L.

wherein the alkali metal halide used is sodium chloride, potassium chloride, sodium bromide, potassium bromide, sodium iodide or potassium iodide, the concentration of the alkali metal halide is 0.001-10 mmol/L.

wherein the etching agent is hydrogen peroxide, which is added in a manner of single-time addition.

wherein the concentration of the etching agent is 0.001-0.5 mol/L, and the diameter of the silver nanowire is controlled by adjusting the amount of the etching agent.

wherein the molar ratio of the silver nitrate to PVP is 1:0.1-100.

wherein the method can be utilized for a large-scale synthesis and the amount of the silver nitrate in the reaction system can be expanded to over 100 g.

Beneficial Effects

Compared with prior art, the present invention has the following advantages:

1. The multi-step method proposed by the present invention, which can be used to large-scale synthesize the nanowires with precisely controlled diameter and length in a wide range, is a big breakthrough of the preparation method for nanowires. Combination of three steps breaks through the restriction of one step method, avoids the interference of isotropic seeds and uncontrollable factors, solves the problem on how to allocate the silver sources reasonably, and achieves the precise controllability of the reaction process and production, thereby being able to achieve large-scale synthesis and apply in industrial production. And the preparation process of the present invention is simple, easy to operate, and suitable for industrial production.

2. The nanowires obtained by the present invention are longer, thicker than those prepared by traditional method. This method can achieve high-yield silver nanowires with the diameter controlled precisely in the range between several nanometers and microns, which can reach more than 300 µm. Such breakthrough in the diameter and length of nanowires enhances the optical performance parameter, which significantly improve the optical and electrical performance of waveguide devices and thin film devices based on silver nanowires. For nano-waveguide, compared with traditional nanowires, the ultralong silver nanowires with a diameter in micron scale and length of more than 300 µm can restrict more light within the silver nanowires, improve the excitation efficiency, and achieve excitation and transmission for high-order mode. And the developed nanowire optical devices can transmit the subwavelength optical signals to farther distances for providing long-distance-transmission of the subwavelength optical signal with technical methods and raw material mediums, which can develop of the subwavelength optical devices. For thin film devices, compared with extant nanowires with a general size of 40 nm, the nanowires with a diameter of several nanometers and a higher aspect ratio can achieve a higher transmittance, and greatly reduce the haze of the thin film. Therefore, it can break through the bottleneck of thin film devices whose haze reach the same level as ITO thin film, propelling the development of newly-flexible thin film devices.

BRIEF DESCRIPTION OF THE DRAWINGS

FIG. 1 (b) is a scanning electron microscope (SEM) view of the silver nanowires prepared in case of hydrogen peroxide being 0.05 mmol in embodiments;

FIG. 1 (c) is a scanning electron microscope (SEM) view of the silver nanowires prepared in case of hydrogen peroxide being 0.01 mmol in embodiments;

FIG. 1 (d) is a scanning electron microscope (SEM) view of the silver nanowires prepared in case of hydrogen peroxide being 0.005 mmol in embodiments;

Figures 1A, 1B:
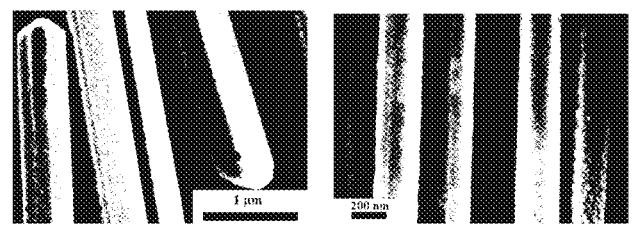
FIG. 1 (a) is a scanning electron microscope (SEM) view of the silver nanowires prepared in case of hydrogen peroxide being 0.1 mmol in embodiments.

DETAILED DESCRIPTION step 1, phase of screening of crystal seeds:
heating ethylene glycol solution containing a surfactant at a temperature of 140 to 160° C. to obtain a solution I with a strong reducibility; adding alkali metal halide dissolved in ethylene glycol into the solution I to yield a solution II; dissolving silver nitrate in ethylene glycol for preparing a precursor solution, the concentration of silver nitrate is between 0.001 to 5 mol/L;

adding the precursor solution into the solution II that reduces silver nitrate rapidly into a large number of multiple twinned crystal seeds with different sizes and part of isotropic seeds; adding etching agent into the above solution with a large number of crystal seeds results in preferentially etching the isotropic seeds which are not resistant to etching and the multiple various sizes of the twinned crystals, thus screening limited amount of particular sizes of the multiple twinned crystal seeds;

step 2, phase of breaking through the threshold of etching multiple twinned crystal seeds:
after the addition of etching agent in Step 1, increasing the reaction temperature immediately to 160-200° C. for a continuous reaction in the temperature until turbidities appearing; increasing the temperature significantly boosts the reaction rate until the threshold of etching multiple twinned crystal seeds by few by-products, namely nitric acid, is broken through;

step 3, phase of longitudinal growth:
decreasing the reaction temperature to 60-140° C. for a completed reaction under such condition once the appearance of turbidities; the decrease of temperature, which effectively reduces the reaction rate and depletes the isotropic seeds generated by self-nucleation, allows more free silver ions to be reduced longitudinally along nanowires for obtaining ultralong silver nanowires.

Wherein,
The surfactant is polyvinylpyrrolidone (PVP) or the surfactant is capable of being absorbed on <100> crystal surface, mainly including sodium polystyrene sulphonate (PSS), polyacrylic acid (PAA); the concentration of PVP in the reaction system is 0.001-10 mol/L.

The alkali metal halide used is sodium chloride, potassium chloride, sodium bromide, potassium bromide, sodium iodide or potassium iodide, the concentration of the alkali metal halide is 0.001-10 mmol/L.

The etching agent is hydrogen peroxide, which is added in a manner of single-time addition.

The concentration of the etching agent is 0.001-0.5 mol/L, and the diameter of the silver nanowire is controlled by adjusting the amount of the etching agent.

The molar ratio of the silver nitrate to PVP is 1:0.1-100.

The method can be utilized for a large-scale synthesis and the amount of the silver nitrate in the reaction system can be expanded to over 100 g.

In the present invention, the synthesis of silver nanowires experiences three important phases.

The first phase is to select crystal seeds. The ethylene glycol is fully counterflow heated to produce acetaldehyde with strong reducibility, which reduces the silver ions to generate a large number of multiple twinned crystal seeds and parts of isotropic seeds. The nanowires with nonuniform thickness may be generated without selection as there are either larger seeds or smaller seeds in the solution. Adding a certain amount of hydrogen peroxide can significantly select crystal seeds formed in early reaction. The addition of a large amount of hydrogen peroxide etch isotropic seeds and smaller crystal seeds, which will generate the silver nanowires with thinner diameter, and mainly preserve the larger crystal seeds, resulting in thick silver nanowires; a small amount of hydrogen peroxide only etch the isotropic seeds and smaller crystal seeds are preserved to produce the silver nanowires with thin diameter; therefore, the purpose of controlling the diameter of silver nanowires can be reached by adjusting the amount of hydrogen peroxide in selection of crystal seeds. In addition, when the amount of reaction is enlarged, the isotropic seeds existed in solution are easier to absorb the silver atoms to form nanoparticles, which severely retard the generation of nanowires and impose a fatal effect on the reaction. And the addition of hydrogen peroxide etches most isotropic seeds which are not resistant to etching to increase the yield of nanowires. This plays a critical role in enlarging the amount of reaction and achieving industrial production.

The second phase is to break through the threshold of etching multiple twinned crystal seeds. During the process of reducing the silver ions by acetaldehyde, hydrogen ions are produced, which combine with the nitrate ions to form nitric acid etching multiple twinned crystal seeds; however, after the selection by hydrogen peroxide the amount of crystal seeds considerably decrease in the reaction system, at the same time nitric acid gradually accumulates. In such condition, most multiple twinned crystal seeds in solution will be etched so as to obtain no products. Thus, after the addition of hydrogen peroxide, temperature should be immediately raised to increase reaction rate so as to break through the threshold of etching silver nanowires; if the temperature is not raised, the solution will gradually become clear under the etching effect of nitric acid, that is to say, most of silver nanowires are etched.

The third phase is to lower temperature for long-time reaction. The decrease of temperature after breaking through reverse-etching slows down the reaction rate, thus promoting the bigger ones to eat the smaller ones. Due to the decrease of the probability of self-nucleation forming isotropic seeds in the low temperature environment, most of the residual silver ions are reduced radially along a small amount of survival crystal seeds. The small amounts of the crystal seeds increase the amount of silver ions assigned to each crystal seed, causing the generated silver nanowire is longer than that generated by traditional method. Moreover, small crystal nucleus gradually absorbs on the radial direction of large nucleus or the silver nanowires such that the high-yield ultralong thick nanowire is produced. Otherwise, the reaction rate in high temperature facilitates self-nucleation to generate isotropic seeds that may preferentially absorb silver ions for growth, thereby retarding the longitudinal growth of nanowires. Simultaneously, the amount of crystal nucleus in the reaction system increases and the silver sources used for the growth of nanowires decreases, thus the produced wire being shorter.

The multi-step method proposed by the present invention is different from the traditional one-step method, constructing the most advantageous external conditions for all different reaction phases and fully meeting the demand for different phases of the growth of nanowires. The process of the increase and decrease of temperature just satisfies different demands for reaction rate in different phases. In traditional methods, there are also such methods in which high temperature or low temperature remains the whole reaction phases. However, these two kinds of heating manner can only meet the reaction requirements of nanowires at a certain phase instead of fitting the law of nanowire growth, so both the diameter size and yield of the prepared nanowires cannot achieve the effects similar to the nanowires prepared by the present invention.

The present invention is further described by means of specific embodiments and comparison examples below:

EMBODIMENTS 1. 0.5 g polyvinylpyrrolidone is dissolved in 150 ml ethylene glycol and then heated under 150° C.
2. Sodium chloride solution in ethylene glycol with concentration of 0.01 mol/L is configured to be used later;
0.15 g silver nitrate is dissolved in ethylene glycol and to be used later.
3. 0.3 ml sodium chloride-ethylene glycol is added into the solution;
4. The solution of silver nitrate is added, followed by dripping of 0.1 mmol hydrogen peroxide.
5. The temperature is rapidly raised to 175° C. until turbidities appear in the solution.
6. The temperature is lowered to 130° C. for full reaction, then the silver nanowires can be obtained by natural cooling down.

Figures 1C, 1D:
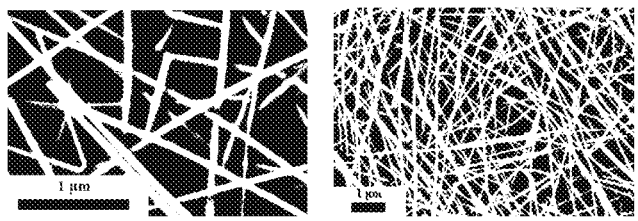
Figure 2:
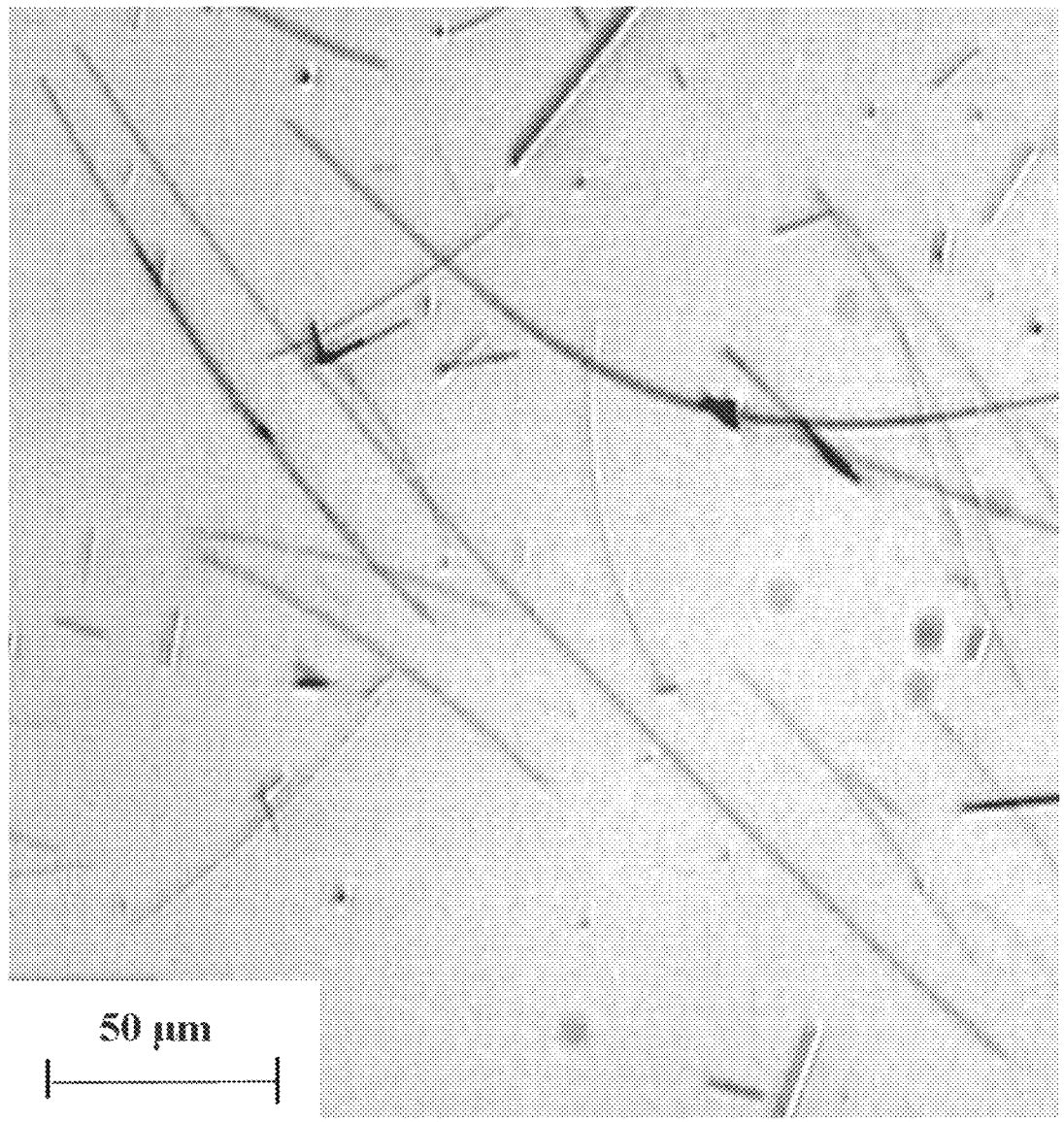
FIG. 2 is an optical view (enlarged by 20 times) of the silver nanowires prepared in case of hydrogen peroxide being 0.1 mmol in embodiments.

The SEM picture of silver nanowires prepared by these embodiments is illustrated in FIG. 1 (a) and the optical picture in FIG. 2. When the amount of hydrogen peroxide is respectively adjusted to 0.05 mmol, 0.01 mmol, 0.005 mmol with other conditions being unchanged, the SEM pictures of silver nanowires prepared are shown in FIG. 1 (b), 1 (c), 1 (d), respectively.

As shown in FIGS. 1 (a) and 2, the silver nanowires prepared by the embodiments has an average diameter of 600 nm and length of more than 300 μm, wherein the diameter is 3-11 times and the length is longer than that of the silver nanowires made by the traditional synthetic method.

As shown in FIGS. 1 (b), 1 (c) and 1 (d), the obtained silver nanowires have an average diameter of 300 nm, 150 nm, 50 nm, respectively. The silver nanowires show the characteristics of the length up to hundreds of microns, higher aspect ratio, uniform diameters, good dispersion and precise control of diameter within a narrow range. In addition, modifications can be made by those skilled in the art within the spirit of the present invention, and those modifications made according to the spirit of the present invention should be contained within the range claimed for protection by the present invention.

What is claimed is:
1. A method of large-scale multi-step synthesis for a silver nanowire with a controllable diameter comprising the following steps:
   1) a step of screening of crystal seeds comprising:
      heating ethylene glycol solution containing a surfactant at a temperature of 140 to 160° C. to obtain a solution I with a strong reducibility; dissolving alkali metal halide in ethylene glycol which is added into the solution I to yield a solution II; dissolving silver nitrate in ethylene glycol for preparing a precursor solution, the concentration of silver nitrate is between 0.001 to 5 mol/L;
      adding the precursor solution into the solution II that reduces silver nitrate rapidly into a multiple twinned crystal seeds with different sizes and part of isotropic seeds; then adding etching agent into the solution II that results in crystal seeds to etch the isotropic seeds which are not resistant to etching and the multiple various sizes of the twinned crystals, thus screening particular sizes of the multiple twinned crystal seeds;

2) a step reaching a threshold of etching multiple twinned crystal seeds comprising:
adding hydrogen peroxide into the reaction system of Step 1, increasing the reaction temperature up to 160-200° C. for a continuous reaction in the temperature until turbidities appearing; wherein increasing the temperature boosts the reaction rate until the threshold of etching multiple twinned crystal seeds is reached for by-products; the by-products including nitric acid;
3) a step of longitudinal growth comprising:
decreasing the reaction temperature 60-140° C. for a completed reaction when the turbidities appear; wherein decreasing the reaction temperature reduces the reaction rate and depletes the isotropic seeds generated by self-nucleation, allows more free silver ions to be reduced longitudinally along nanowires for obtaining the silver nanowire;
wherein length of the silver nanowire is at least 300 μm.

2. The method according to claim 1, wherein the surfactant is polyvinylpyrrolidone (PVP); the concentration of PVP in the reaction system is 0.001-10 mol/L.

3. The method according to claim 1, wherein the alkali metal halide is selected from a group consisting of sodium chloride, potassium chloride, sodium bromide, potassium bromide, sodium iodide and potassium iodide; the concentration of the alkali metal halide is 0.001-10 mmol/L.

4. The method according to claim 1, wherein the etching agent is hydrogen peroxide, which is added in a manner of single-time addition.

5. The method according to claim 1, wherein the concentration of the hydrogen peroxide is 0.001-0.5 mol/L, and the diameter of the silver nanowire is controlled by adjusting the amount of the hydrogen peroxide.

6. The method according to claim 1, wherein the molar ratio of the silver nitrate to PVP is 1:0.1-100.

7. The method according to claim 1, wherein the method can be utilized for a large-scale synthesis and the amount of the silver nitrate in the reaction system can be expanded to over 100 g.

* * * * *